(12) United States Patent
Smith et al.

(10) Patent No.: US 8,480,861 B2
(45) Date of Patent: Jul. 9, 2013

(54) METHOD OF TREATING GAS

(75) Inventors: James Robert Smith, Taunton (GB); Marilena Radoiu, Lyons (FR); Stephen John Coles, North Somerset (GB)

(73) Assignee: Edwards Limited, Crawley, West Sussex (GB)

( * ) Notice: Subject to any disclaimer, the term of this patent is extended or adjusted under 35 U.S.C. 154(b) by 951 days.

(21) Appl. No.: 12/084,361

(22) PCT Filed: Sep. 28, 2006

(86) PCT No.: PCT/GB2006/003597
§ 371 (c)(1),
(2), (4) Date: May 14, 2009

(87) PCT Pub. No.: WO2007/048995
PCT Pub. Date: May 3, 2007

(65) Prior Publication Data
US 2010/0071548 A1 Mar. 25, 2010

(30) Foreign Application Priority Data
Oct. 27, 2005 (GB) .................................. 0521944.9

(51) Int. Cl.
*B01D 53/00* (2006.01)
*B01J 19/08* (2006.01)

(52) U.S. Cl.
USPC ................ 204/157.3; 422/168; 422/186.03

(58) Field of Classification Search
USPC ................ 95/3, 8, 12, 233; 96/19, 397, 417, 96/422; 422/110, 111, 168, 176, 182, 186.04, 422/186.21; 423/240 R; 204/157.3; 588/311
See application file for complete search history.

(56) References Cited

U.S. PATENT DOCUMENTS

| | | | | |
|---|---|---|---|---|
| 5,453,125 A * | 9/1995 | Krogh | ...................... | 118/723 MR |
| 6,153,260 A * | 11/2000 | Comita et al. | ........... | 427/255.23 |
| 6,423,284 B1 * | 7/2002 | Arno et al. | ................ | 423/240 R |
| 6,468,490 B1 * | 10/2002 | Shamouilian et al. | ........ | 423/241 |
| 6,592,817 B1 * | 7/2003 | Tsai et al. | ........................ | 422/62 |
| 6,605,133 B1 * | 8/2003 | Li et al. | ............................. | 95/45 |
| 6,689,252 B1 * | 2/2004 | Shamouilian et al. | ... | 204/157.15 |
| 2002/0033377 A1 | 3/2002 | Namose | | |
| 2008/0262655 A1 * | 10/2008 | Smith et al. | ................... | 700/247 |

FOREIGN PATENT DOCUMENTS

| | | |
|---|---|---|
| EP | 1 201 291 A1 | 5/2002 |
| EP | 1 297 891 A1 | 4/2003 |
| EP | 1 371 750 A1 | 12/2003 |
| JP | 2004-223365 | 8/2004 |
| WO | WO 2006/067384 A1 | 6/2006 |
| WO | WO 2006/117531 A1 | 11/2006 |

OTHER PUBLICATIONS

Ino Kazuhide, Arakawa Takahiro; English language abstract of Publication No. JP 2004223365 A, entitled "Gas Treatment Equipment," Rohm Co ltd, Aug. 12, 2004.

(Continued)

*Primary Examiner* — Duane Smith

(57) ABSTRACT

In a method of treating a gas exhausted from a process chamber, the exhaust gas is conveyed to a vacuum pump (20) and a nitrogen purge gas is added to the exhaust gas for pumping with the exhaust gas. Gas exhaust from the pump is conveyed to an abatement device (28) for abating the exhaust gas. The amount of purge gas added to the exhaust gas is adjusted in response to a variation of the composition of the exhaust gas, or the composition of the gas supplied to the process chamber, to optimise the abatement of the exhaust gas.

23 Claims, 3 Drawing Sheets

OTHER PUBLICATIONS

United Kingdom Search Report of Application No. GB 0521944.9; Claims searched: 1-8, 10-26 & 28-32; Date of search: Jan. 24, 2006.
PCT Notification of Transmittal of the International Search Report and the Written Opinion of the International Searching Authority, or the Declaration of International Application No. PCT/GB2006/003597; Date of mailing: Jan. 23, 2007.

PCT International Search Report of International Application No. PCT/GB2006/003597; Date of mailing of the International Search Report: Jan. 23, 2007.
PCT Written Opinion of the International Searching Authority of International Application No. PCT/GB2006/003597; Date of mailing: Jan. 23, 2007.

* cited by examiner

METHOD OF TREATING GAS

FIELD OF THE INVENTION

The present invention relates to a method of, and apparatus for, treating gas exhausted from a process chamber.

BACKGROUND OF THE INVENTION

Various different gases may be supplied to a process chamber during the formation of a semiconductor or flat panel display device within the chamber. In a chemical vapour deposition process, gases are supplied to a process chamber housing the substrate and react to form a thin film over the surface of the substrate. For example, a LPCVD (low pressure chemical vapour deposition) nitride process uses DCS (dichlorosilane) and ammonia to form silicon nitride on the surface of a wafer. In an etch process, gases such as boron trichloride and chlorine may be supplied to the chamber to remove unwanted aluminium, and in a polysilicon etch process, hydrogen bromide and chlorine are supplied to the chamber. Cleaning gases such as the perfluorinated compounds $CF_4$, $C_2F_6$, $NF_3$ and $SF_6$, and fluorine ($F_2$) may be periodically supplied to the chamber to clean unwanted deposits from the chamber.

Some of these processes may lead to the formation of condensable species. The LPCVD process can produce HCl, which can react with excess ammonia to form aluminium chloride, and the metal etch process can produce aluminium chloride, each of which can readily condense within the foreline extending from the chamber outlet to a vacuum pump used to pump gas exhausted from the chamber, the exhaust line leading from the vacuum pump and/or within the vacuum pump itself. The polysilicon etch process can also lead to the formation of condensable species, in particular silicon tetrachloride. Condensation of particulates within the pump can result in the filling of the vacant running clearances between the rotor and stator elements of the pump, leading to a loss of pumping performance and ultimately pump failure. In view of this, it is common practice to supply an inert purge gas, typically nitrogen, at a flow rate of around 40 to 50 slm to the exhaust line or to one or more purge ports of the vacuum pump to reduce the partial pressure of the condensable species within the pump to a value at which substantially no condensation takes place within the pump.

Perfluorinated (PFC) cleaning gases are greenhouse gases, and so in view of this, before the exhaust gas is vented to the atmosphere, an abatement device is typically provided to treat the exhaust gas to convert the PFC gases into species that can be readily removed from the exhaust gas, for example by conventional scrubbing, and/or can be safely exhausted to the atmosphere. However, in view of the relatively high flow rate of purge gas added to the exhaust gas in comparison to the flow rate of the exhaust gas from the process chamber (typically around 5 slm), the addition of purge gas can significantly decrease the destruction efficiency of the abatement device. Abatement technology may involve contacting the exhaust gas with either reaction surfaces or high-energy discharges, and so the higher the mass flow rate through the abatement device, the lower the contact time between the exhaust gas and these surfaces or discharges, and hence the lower the destruction efficiency. This is particularly important in relation to the perfluorinated cleaning gases such as $CF_4$ and $SF_6$, which tend to be relatively difficult to destroy.

SUMMARY OF THE INVENTION

The present invention provides a method of treating gas exhausted from a process chamber, the method comprising the steps of conveying the exhaust gas to a vacuum pump, and conveying the exhaust gas from the pump to an abatement device, wherein purge gas is added to the exhaust gas upstream from the abatement device, the amount of purge gas added to the exhaust gas being controlled to optimise the abatement of the exhaust gas.

The present invention provides apparatus for treating a gas exhausted from a process chamber, the apparatus comprising a vacuum pump for receiving the exhaust gas from the process chamber, an abatement device for receiving the exhaust gas from the pump, a purge gas supply system for adding purge gas to the exhaust gas upstream from the abatement device, and a control system for adjusting the amount of purge gas added to the exhaust gas to optimise the abatement of the exhaust gas.

Features described above in relation to method aspects of the invention are equally applicable to apparatus aspects of the invention, and vice versa.

BRIEF DESCRIPTION OF THE DRAWINGS

Preferred features of the present invention will now be described with reference to the accompanying drawing, in which.

DETAILED DESCRIPTION OF THE INVENTION

Figure 1:
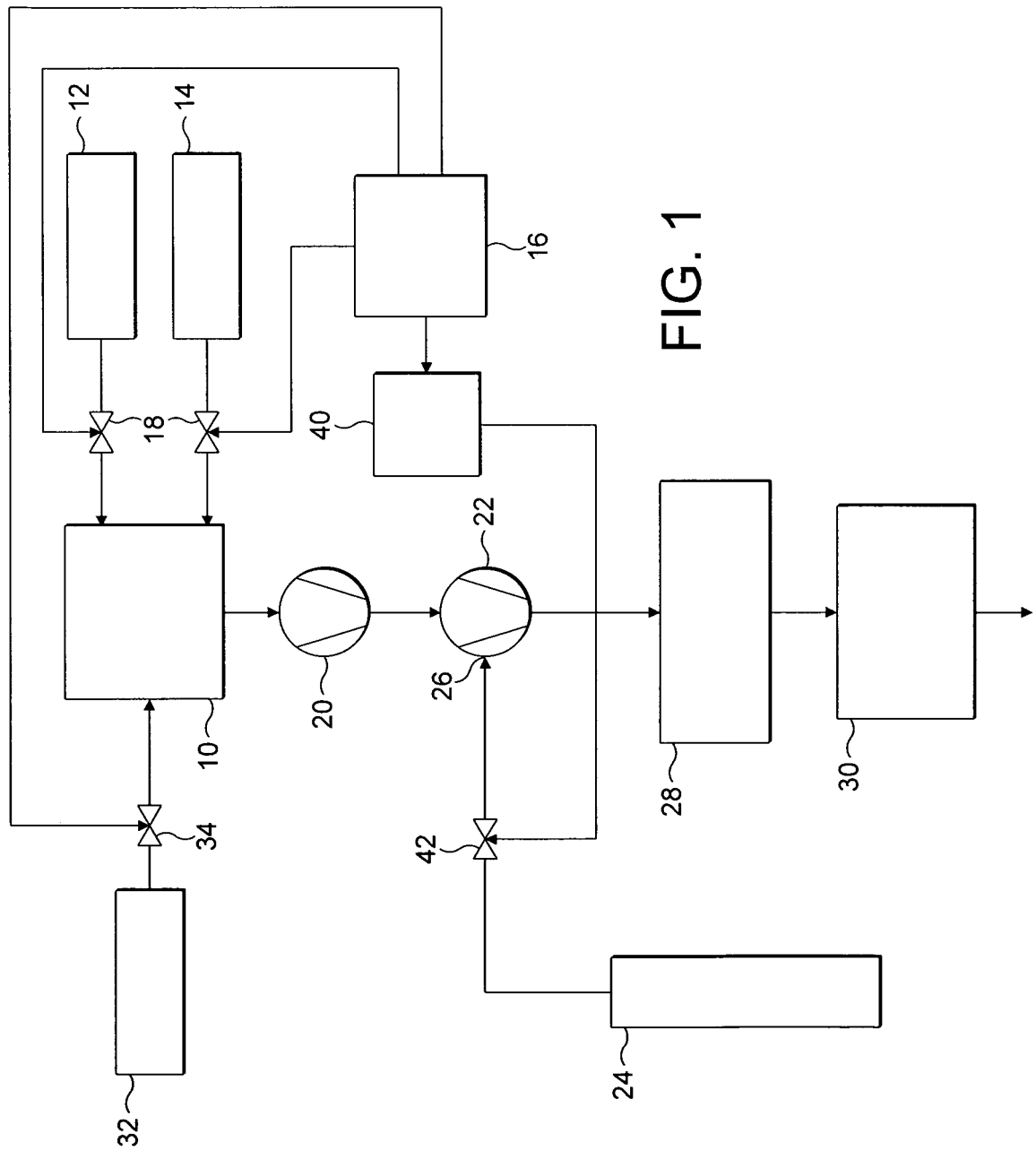
FIG. 1 illustrates a first embodiment of an apparatus for treating gas exhaust from a process chamber.

In a first aspect, the present invention provides a method of treating gas exhausted from a process chamber, the method comprising the steps of conveying the exhaust gas to a vacuum pump, and conveying the exhaust gas from the pump to an abatement device, wherein purge gas is added to the exhaust gas upstream from the abatement device, the amount of purge gas added to the exhaust gas being controlled to optimise the abatement of the exhaust gas.

The supply of purge gas such as nitrogen or argon can be optimised according to the composition of the exhaust gas, or of the gases supplied to the process chamber. For example, when the composition of the exhaust gas is such that the exhaust gas contains one or more condensable species such as ammonium chloride, aluminium chloride and silicon tetrachloride, when a device processing step is being conducted in the chamber, the amount of purge gas added to the exhaust gas may be increased, or maintained at a relatively high level, to reduce the partial pressure of the condensable species to a value at which condensation of the condensable species is substantially inhibited, thereby protecting the pump. When the gas contains a corrosive such as HBr or HCl, the amount of purge gas added to the exhaust gas may be increased, or maintained at a relatively high level, to flush the corrosive from the pump. Alternatively, or additionally, when the exhaust gas contains hydrogen, or at least a predetermined amount of hydrogen, the amount of purge gas added to the exhaust gas may be adjusted to a value that inhibits backstreaming of hydrogen within the pump towards the pump inlet, thereby maintaining a relatively high hydrogen pumping efficiency.

When the exhaust gas contains a fluorine-containing component, for example $F_2$ or a perfluorinated gas such as $CF_4$, $NF_3$ and $SF_6$, the gas stream will contain little or no corrosives or condensable species, and so the amount of purge gas added to the exhaust gas may be reduced, or maintained at a relatively low level, in order to increase the destruction efficiency of that gas, and thereby optimise the abatement of that gas, in an abatement device located downstream from the pump. Therefore, in a second aspect the present invention provides a method of treating gas exhausted from a process chamber to which a first gas and a second gas are supplied at different times, the second gas comprising a fluorine-containing component, the method comprising the steps of conveying the exhaust gas to a vacuum pump, and conveying the exhaust gas from the pump to an abatement device, wherein purge gas is added to the exhaust gas upstream from the abatement device, the amount of purge gas added to the exhaust gas having a first value when the first gas is supplied to the process chamber, and a second value, lower than the first value, when the second gas is supplied to the process chamber.

The amount of purge gas added to the exhaust gas may be subsequently increased when said fluorine-containing component is no longer supplied to, or exhausted from, the chamber, for example when the exhaust gas contains one or more condensable species.

The amount of purge gas added to the exhaust gas is preferably adjusted in response to the reception of data indicative of the variation of the composition of the exhaust gas. In a preferred embodiment, the exhaust gas is exhaust from a chamber of a process tool, with the data indicative of the variation of the chemistry of the exhaust gas being supplied by the process tool. Alternatively, the data may be supplied by a host computer that receives the data from the process tool, or from a sensor located between the chamber and the pump. The data may alternatively be indicative of the composition of the gas supplied to the chamber, as from this data the composition of the exhaust gas, and so the amount of condensable species that would be present within the exhaust gas, may be predicted. For example, the controller may receive data indicative of the variation of the gas composition obtained by monitoring one or more variable flow control devices used to supply gas to the process chamber. The opening and closing of one or more valves for supplying gases to the process chamber may be detected, and/or the conductance of one or more mass flow controllers for controlling the rate at which gases are supplied to the process chamber may be detected, for example by monitoring signals supplied to these devices.

The purge gas may be added to the exhaust gas upstream and/or downstream from the pump. If the pump is a multi-stage pump, the purge gas may alternatively, or additionally, be added to the exhaust gas between stages of the pump.

The abatement device may use any suitable technique for abating the exhaust gas with the required efficiency. A preferred technique is a plasma abatement technique, using either a microwave plasma device or a dc plasma torch to abate the exhaust gas. Depending on the abatement technique used to abate the exhaust gas, the amount of purge gas added to the exhaust gas is preferably maintained above a predetermined level, for example between 5 and 15 slm, in order to maintain the gas flow rate through the abatement device above this minimum level. For example, if the abatement device uses a plasma abatement technique to abate the gas, allowing the gas flow rate through the abatement device to fall below this predetermined level can affect the abatement process. Consequently, if insufficient purge gas is added to the exhaust gas upstream from or between the stages of the pump, the amount of purge gas added to the exhaust gas downstream from the pump may be adjusted to maintain the gas flow rate through the abatement device above this minimum level.

The amount of purge gas added to the exhaust gas may be adjusted by varying the rate at which the purge gas is supplied to the exhaust gas. For example, a variable flow control device such as a valve may be provided for varying the rate at which purge gas is supplied to the exhaust gas. A controller may be provided for controlling the conductance of the variable flow control device with variation of the composition of the exhaust gas. The rate at which purge gas is supplied to the exhaust gas may be varied between 5 and 100 slm, for example between 10 and 40 slm, depending on the composition of the exhaust gas.

The exhaust gas may be exhaust gas from a process chamber in which a chemical vapour deposition process is performed, or from a chamber in which an etch process is performed on a metal or semiconductor.

In a third aspect the present invention provides apparatus for treating a gas exhausted from a process chamber, the apparatus comprising a vacuum pump for receiving the exhaust gas from the process chamber, an abatement device for receiving the exhaust gas from the pump, a purge gas supply system for adding purge gas to the exhaust gas upstream from the abatement device, and a control system for adjusting the amount of purge gas added to the exhaust gas to optimise the abatement of the exhaust gas.

In a fourth aspect the present invention provides apparatus for treating a gas exhausted from a process chamber to which a first gas and a second gas are supplied at different times, the second gas comprising a fluorine-containing component, the apparatus comprising a vacuum pump for receiving the exhaust gas from the process chamber, an abatement device for receiving the exhaust gas from the pump, a purge gas supply system for adding purge gas to the exhaust gas upstream from the abatement device, and a control system for adjusting the amount of purge gas added to the exhaust gas such that the amount of purge gas added to the exhaust gas has a first value when the first gas is supplied to the process chamber, and a second value, lower than the first value, when the second gas is supplied to the process chamber.

With reference to FIG. 1, a process chamber 10 for processing, for example, semiconductor devices, flat panel display devices or solar panel devices, receives various first, process gases for use in performing the processing within the chamber 10. These gases are conveyed to the chamber 10 from respective sources, indicated generally at 12 and 14 in the drawing although any number of sources may be provided. For example, sources of boron trichloride and chlorine may be provided for performing a metal etch process within the chamber 10, sources of ammonia and dichlorosilane may be provided for performing an LPCVD process within the chamber 10, and sources of hydrogen bromide and chlorine may be provided for etching polycrystalline silicon. A process tool 16 controls the supply of the process gases to the chamber 10 by supplying control signals to valves 18 and other flow control devices (not illustrated) for controlling the rate of supply of the process gases to the chamber 10.

An exhaust gas is drawn from the outlet of the chamber 10 by a pumping system. During the processing within the chamber 10, only a portion of the process gases will be consumed, and so the exhaust gas will contain a mixture of the process gases supplied to the chamber, and by-products from the processing within the chamber. The pumping system may comprise a secondary pump 20, typically in the form of a turbomolecular pump or Roots booster pump, for drawing the exhaust gas from the chamber. A turbomolecular pump can generate a vacuum of at least $10^{-3}$ mbar in the chamber 10. Gas is typically exhausted from a turbomolecular pump at a pressure of around 1 mbar, and so the pumping systems also comprises a primary, or backing, pump 22 for receiving the gas exhaust from the turbomolecular pump 20 and raising the pressure of the gas to a pressure around atmospheric pressure.

As discussed above, LPCVD and metal etch processes can result in the production of condensable species as a by-product of the process, and HBr can corrode stainless steel in the presence of moisture. In order to inhibit condensation of these species within the backing pump 22, and to sweep the volume of the pump of any corrosive gases, a nitrogen or argon purge gas is supplied from a source 24 thereof to one or more purge ports 26 of the pump 22 for pumping with the gas exhausted from the chamber 10. The purge gas may alternatively, or additionally, be added to the exhaust gas at the exhaust of the pump 22, with the purge gas back streaming into the pump 22.

In addition to the process gases, second, cleaning gases are periodically supplied to the chamber 10 from a suitable source 32 thereof. These cleaning gases are preferably fluorine-containing gases, such as $F_2$, or a perfluorinated compound, such as $CF_4$ $NF_3$ or $SF_6$. Perfluorinated compounds may also be conveyed to the chamber 10 for other reasons, for example for the plasma etching of openings such as contacts, vias and trenches in materials formed on semiconductor substrates. As illustrated in the drawing, the process tool 16 also controls the supply of the cleaning gas 32 by issuing appropriate control signals to a valve or other variable flow control device 34.

Unconsumed perfluorinated gases are known to have relatively high greenhouse activity, and so before the gas exhaust from the pump 22 is vented to the atmosphere, the gas is conveyed to an abatement device 28 to convert the greenhouse gases into species that can be readily removed from the gas, for example by a wet or dry scrubber 30, and/or can be safely exhausted to the atmosphere.

It is desirable that the abatement device 28 is able to destroy greenhouse gases with high destruction rate efficiency. This efficiency can, however, be compromised by the amount of purge gas added to the exhaust gas to inhibit condensation of condensable species within the backing pump 22 and to remove corrosive gases from the backing pump 22. In view of this, a control system is provided for adjusting the amount of purge gas added to the exhaust gas to optimise the abatement of the exhaust gas. In the illustrated embodiment, the control system is provided by a controller 40 that receives data from the process tool indicative of the composition of the gases supplied to the chamber 10, and outputs appropriate control signals to a valve 42 or other variable flow control device to adjust the amount of purge gas added to the exhaust gas, in this example by varying the flow rate of the purge gas, depending on the received data. Alternatively, the data may be received from a host computer of a local area network of which the controller 40 and the controller of the process tool 16 forms part, the host computer being configured to receive information from the controller of the process tool 16 regarding the composition of the gases supplied to the process tool and to supply this information to the controller 40. As another alternative, the valve 42 may be controlled directly by the controller of the process tool 16. As a further alternative, data relating to the composition of the exhaust gas may be received from a gas sensor located between the outlet of the process chamber 10 and the backing pump 22.

For example, when process gases such as HBr and $Cl_2$ are supplied to the chamber in a polysilicon etch process, the gas exhausted from the chamber is likely to contain $SiCl_4$, which may condense in the backing pump 22, and HBr can be corrode stainless steel components of the pump in the presence of moisture. In response to the receipt of data indicative of the composition of the process gases being supplied to the chamber, the controller 40 outputs a command to the valve 42 that causes the purge gas to be supplied to the exhaust gas at a relatively high rate, for example around 40 to 50 slm. When a perfluorinated gas is supplied to the chamber, either for chamber cleaning or as a process gas, the gas exhausted from the chamber is likely to contain little or no condensable species. Therefore, in response to the receipt of data indicating that a perfluorinated or other fluorine-containing gas is supplied to the chamber, the controller 40 outputs a command to the valve 42 that causes the purge gas to be supplied to the exhaust gas at a relatively low rate, for example around 5 slm, in order to optimise the abatement of that gas in the abatement device 28.

Figure 2:
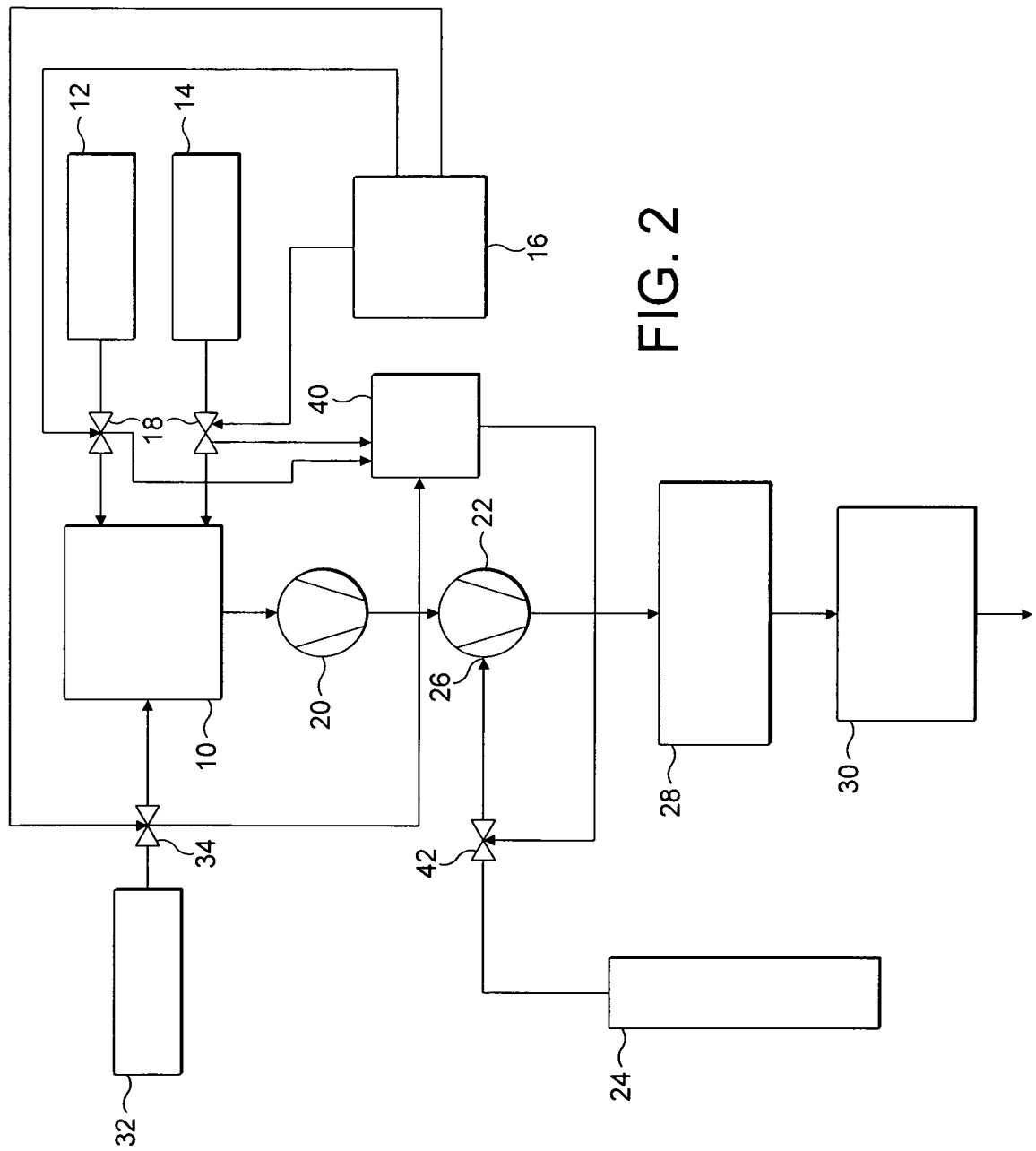
FIG. 2 illustrates a second embodiment of an apparatus for treating gas exhaust from a process chamber.

In the embodiment illustrated in FIG. 2, the controller 40 is isolated from the controller of the process tool. In order to obtain data indicative of a variation of the composition of the gases supplied to the process chamber 10, the controller 40 monitors the state of the valves 18, 34 and other flow control devices used to control the supply of the gases to the process chamber. The controller 40 may receive signals indicating whether the valves 18, 34 are open or closed, and/or signals indicating the conductance of mass flow controllers used to adjust the rate at which the gases are supplied to the chamber. In response to these signals, the controller 40 controls the rate at which the purge gas is added to the exhaust gas.

The abatement device 28 may be configured to receive gas streams exhaust from a plurality of process chambers 10. When a process chamber is not in use, it is a common practice to reduce the speed of the pumps 20, 22 used to evacuate that process chamber, and to reduce the amount of purge gas supplied to the backing pump 22, to save costs. This will have the effect of reducing the total gas flow rate through the abatement device. However, depending on the technique used to abate the exhaust gas within the abatement device, it may be desirable to maintain the gas flow rate through the abatement device above a minimum level in order to maintain the efficiency of the abatement device at a high level. For example, if the abatement device uses a plasma abatement technique to abate the gas, allowing the gas flow rate through the abatement device to fall below a minimum level can affect the abatement process.

Figure 3:
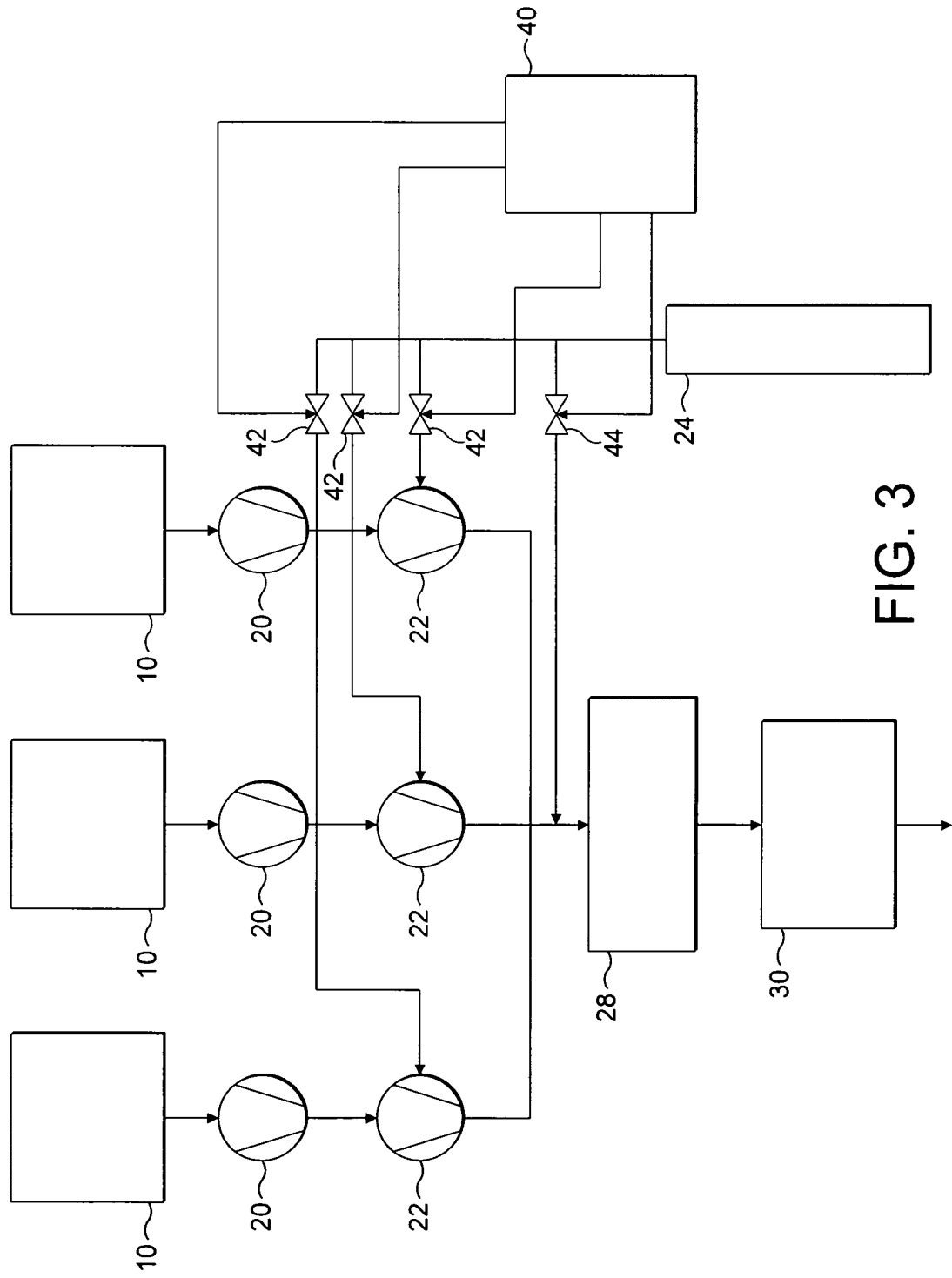
FIG. 3 illustrates a third embodiment of an apparatus for treating gas exhaust from a process chamber.

Therefore, in the event that one or more of the valves 42 is closed or the rate at which purge gas is supplied to one or more of the backing pumps 22 is otherwise reduced, it may be desirable to selectively add purge gas to the exhaust gas. In view of this, in the embodiment illustrated in FIG. 3, the purge gas supply system is configured to selectively add purge gas to the exhaust gas downstream from the backing pumps 22 in dependence on the states of the valves 42. For example, if one or more of the valves 42 are closed, valve 44 may be opened by the controller 40 to add purge gas to the exhaust gas so that at least a minimum amount of purge gas, for example between 5 and 15 slm, is present within the exhaust gas entering the abatement device 28.

While the foregoing description and drawings represent the preferred embodiments of the present invention, it will be apparent to those skilled in the art that various changes and modifications may be made therein without departing from the true spirit and scope of the present invention.

We claim:

1. A method of treating gas exhausted from a process chamber to which a first gas and a second gas are supplied at different times, the second gas comprising a fluorine-containing component, the method comprising the steps of:
    conveying the exhaust gas to a vacuum pump; and
    conveying the exhaust gas from the pump to an abatement device, wherein purge gas is added to the exhaust gas upstream from the abatement device, the amount of purge gas added to the exhaust gas having a first value when the first gas is supplied to the process chamber, and a second value, lower than the first value, when the second gas is supplied to the process chamber, wherein the amount of purge gas added to the exhaust gas is adjusted in response to the reception of data indicative of a variation of the composition of the gas supplied to, or exhausted from, the process chamber, wherein the pump is a multi-stage pump, and the purge gas is added to the exhaust gas between stages of the pump.

2. The method according to claim 1, wherein the fluorine-containing component comprises one of $F_2$ and a perfluoro-compound.

3. The method according to any of claim 1 comprising increasing the amount of purge gas added to the exhaust gas when the fluorine-containing component is no longer supplied to, or exhausted from, the chamber.

4. The method according to claim 1 comprising increasing the amount of purge gas added to the exhaust gas when the exhaust gas contains one or more condensable species.

5. The method according to claim 1 wherein the exhaust gas is exhaust from a process chamber of a process tool, the data indicative of the variation of said composition being supplied by the process tool.

6. The method according to claim 1 comprising obtaining the data by monitoring one or more variable flow control devices used to supply gas to the process chamber.

7. The method according to claim 1 comprising adjusting the amount of purge gas added to the exhaust gas by varying the rate at which the purge gas is supplied to the exhaust gas.

8. The method according to claim 1 comprising maintaining the amount of purge gas added to the exhaust gas above a value between 5 and 15 slm.

9. The method according to claim 1 comprising adding purge gas to the exhaust gas upstream from the pump.

10. The method according to claim 1 comprising adding purge gas to the exhaust gas downstream from the pump.

11. The method according to claim 10 comprising adjusting the amount of purge gas added to the exhaust gas downstream from the pump in dependence on the amount of purge gas added to the exhaust gas upstream from or between stages of the pump.

12. The method according to claim 1 wherein the abatement device is a plasma abatement device.

13. The method according to claim 1 wherein the process chamber is a chemical vapour deposition chamber.

14. The method according to claim 1 wherein the process chamber is an etch chamber.

15. Apparatus for treating a gas exhausted from a process chamber to which a first gas and a second gas are supplied at different times, the second gas comprising a fluorine-containing component, the apparatus comprising:
    a vacuum pump for receiving the exhaust gas from the process chamber;
    an abatement device for receiving the exhaust gas from the pump;
    a purge gas supply system for adding purge gas to the exhaust gas upstream from the abatement device; and
    a control system for adjusting the amount of purge gas added to the exhaust gas such that the amount of purge gas added to the exhaust gas has a first value when the first gas is supplied to the process chamber, and a second value, lower than the first value, when the second gas is supplied to the process chamber,
    wherein the pump is a multi-stage pump, and the purge gas supply system is configured to add purge gas to the exhaust gas between stages of the pump.

16. The apparatus according to claim 15 wherein the control system comprises a controller for receiving data indicative of the variation of the composition of the gas supplied to, or exhausted from, the process chamber, and for adjusting the amount of purge gas added to the exhaust gas in response thereto.

17. The apparatus according to claim 16 wherein the control system comprises a variable flow control device for varying the rate at which purge gas is supplied to the exhaust gas, and wherein the controller is configured to control the variable flow control device with variation of said composition.

18. The apparatus according to claim 16 wherein the control system is configured to vary the rate at which purge gas is supplied to the exhaust gas between 10 and 40 slm depending on said composition.

19. The apparatus according to claim 15 wherein the control system is configured to maintain the amount of purge gas within the exhaust gas received by the abatement device above a value between 5 and 15 slm.

20. The apparatus according to claim 15 wherein the purge gas supply system is configured to add purge gas to the exhaust gas upstream from the pump.

21. The apparatus according to claim 15 wherein the abatement device is a plasma abatement device.

22. The apparatus accordingly to claim 15 wherein the purge gas supply system is configured to add a supplemental amount of the purge gas to the exhaust gas downstream from the pump.

23. The apparatus of claim 22 wherein the control system is configured to adjust the supplemental amount of the purge gas added to the exhaust gas downstream from the pump in dependence on the amount of the purge gas added to the exhaust gas upstream from the pump.

* * * * *